United States Patent
Wong et al.

(10) Patent No.: US 6,875,274 B2
(45) Date of Patent: Apr. 5, 2005

(54) CARBON NANOTUBE-NANOCRYSTAL HETEROSTRUCTURES AND METHODS OF MAKING THE SAME

(75) Inventors: Stanislaus S. Wong, Middle Island, NY (US); Sarbajit Banerjee, Stony Brook, NY (US)

(73) Assignee: The Research Foundation of State University of New York, Albany, NY (US)

( * ) Notice: Subject to any disclaimer, the term of this patent is extended or adjusted under 35 U.S.C. 154(b) by 151 days.

(21) Appl. No.: 10/342,147

(22) Filed: Jan. 13, 2003

(65) Prior Publication Data

US 2005/0022726 A1 Feb. 3, 2005

(51) Int. Cl.[7] .............................................. C30B 23/02
(52) U.S. Cl. ...................... 117/105; 117/106; 117/924; 423/445
(58) Field of Search ................................ 117/105, 106, 117/924; 423/445

(56) References Cited

PUBLICATIONS

A.P. Alivisatos, "Perspectives on the Physical Chemistry of Semiconductor Nanocrystals", *J. Phys. Chem.*, 100:13226–13239(1996).

Banarjee et al., "Functionalization of Carbon Nanotubes with a Metal–Contatining Molecular Complex", *Nano Letters*, 2(1):49–53(2002).

Banarjee et al., "Structural Characterization, Optical Properties, and Improved Solubility of Carbon Nanotubes Functionalized with Wilkinson's Catalyst", *J. Am. Chem. Soc.*, 124(30):8940–8948(2002).

Banarjee et al., "Synthesis and Characterization of Carbon Nanotube–Nanocrystal Heterostructures", *Nano Letters*, 2(3):195–200(2002).

Dabbousi et al., "(CdSe)ZnS Core–Shell Quantum Dots: Synthesis and Characterization of a Size Series of Highly Luminescent Nanocrystallites", *J. Phys. Chem. B.*, 101:9463–9475(1997).

Kahn et al., "Solubilization of Oxidized Single–Walled Carbon Nanotubes in Organic and Aqueous Solvents through Organic Derivatization", *Nano Letters*, 2(11):1215–1218(2002).

*Primary Examiner*—Robert Kunemund
(74) *Attorney, Agent, or Firm*—Hoffmann & Baron, LLP

(57) ABSTRACT

The present invention provides a heterostructure which includes a carbon nanotube covalently linked to at least one nanocrystal. Methods for making such heterostructures, and methods for modifying the physical properties of nanotubes are also provided.

84 Claims, 4 Drawing Sheets

CARBON NANOTUBE-NANOCRYSTAL HETEROSTRUCTURES AND METHODS OF MAKING THE SAME

BACKGROUND OF THE INVENTION

The present invention relates to the art of nanotechnology, and in particular, to carbon nanotube technology, its function and structure.

A carbon nanotube is a single graphene sheet in the form of a seamless cylinder. The ends of a nanotube typically have hemispherical caps. The typical diameter of a nanotube ranges from about 1 nm to 10 nm. The length of a nanotube potentially can be millions of times greater than its diameter.

Carbon nanotubes are comprised of shells of $sp^2$-hybridized carbon atoms forming a hexagonal network that is itself arranged helically within the cylinder. Basically, helicity is the arrangement of the carbon hexagonal rings with respect to a defined axis of a tube. (M. S. Dresselhaus et al "Science of Fullerenes and Carbon Nanotubes" (Academic Press, New York, 1996)).

Carbon nanotubes are grown by combining a source of carbon with a catalytic nanostructured material such as iron or cobalt at elevated temperatures. At such temperatures, the catalyst has a high solubility for carbon. The carbon links up to form graphene and wraps around the catalyst to form a cylinder. Subsequent growth occurs from the further addition of carbon.

Since their discovery in the early 1990s, carbon nanotubes have been the focus of intense study due to their very desirable and unique combination of physical properties. They are chemically inert, thermally stable, highly strong, lightweight, flexible and electrically conductive. In fact, carbon nanotubes may potentially be stiffer and stronger than any other known material.

Carbon nanotubes are currently being proposed for numerous applications, such as, for example, catalyst supports in heterogeneous catalysis, high strength engineering fibers, sensory devices and molecular wires for the next generation of electronics devices.

There has been particularly intense study of the electrical properties of nanotubes, and their potential applications in electronics. Metallic carbon nanotubes have conductivities and current densities that meet or exceed the best metals; and semiconducting carbon nanotubes have mobilities and transconductance that meet or exceed the best semiconductors.

The physical properties of carbon nanotubes are structure-dependent. For example, depending on the diameter and helicity of a nanotube, the tube can be either metallic or semi-conducting. Also, a single structural defect in a hexagonal ring can change a metallic nanotube to a semiconducting nanotube.

Current methods for producing nanotubes do not allow for the control of the structural properties of nanotubes in a reliable, rapid and reproducible manner. A mixture of tubes with diverse diameters, helicities and structural defects are produced. Thus, a mixture of metallic and semi-conductng nanotubes are produced. This presents a major obstacle to actualizing the utility of carbon nanotubes for end use applications.

Accordingly, there remains a need for a method of producing carbon nanotubes with the particular desired physical properties which are necessary for various end use applications.

SUMMARY OF THE INVENTION

The present invention provides methods for preparing nanotubes with desired physical properties and for adjusting the physical properties of nanotubes. Nanocrystals are covalently linked to nanotubes to provide heterostructures with the physical properties which are necessary for particular end use applications.

Accordingly, the present invention includes a heterostructure which includes a carbon nanotube covalently linked to a least one nanocrystal. The linkage can be between one of: 1) a carbonyl oxygen of the carbon nanotube and the nanocrystal; 2) between a carbonyl carbon of the carbon nanotube and a functional group on the nanocrystal; and 3) between a carbonyl carbon of the carbon nanotube and a functional group on a linker attached to the nanocrystal.

The nanocrystal is preferably a transition metal chalcogenide. The chalcogenide nanocrystal can be a wurtzite cadmium selenide, cadmium sulfide, cadmium telluride, zinc selenide or zinc sulfide. The nanocrystal can also be a metal oxide such as titanium dioxide. The nanocrystal can also be a colloidal elemental metal such as wherein the elemental metal is gold, silver, platinum or copper.

The covalent linkage formed between a carbonyl atom of the nanotube can be with an amine group attached to the nanocrystal. The amine group can be directly attached to the nanocrystal or part of an organic molecular linker wherein the linker includes less than about twenty carbon atoms. The organic molecule linker can be a bifunctional amine such as an alkyl or aryl diamine derivative. Such diamine derivatives can be selected from the group consisting of ethylenediamine and semicarbazide.

Referring to the nanotube, the tube can be single-walled or multi-walled. Furthermore, the carbon nanotube can be a semiconductor or metallic. A single-walled nanotube can be from about 0.7 nm to about 2.5 nm in diameter. A multi-walled nanotube can be from about 3 to about 30 nm in diameter. The nanocrystal, in turn, can have a particle size of from about 1 to about 20 nm.

The heterostructure can be such that the end of the carbon nanotube is open.

The present invention also includes a method of producing a nanotube-nanocrystal heterostructure comprising a nanocrystal covalently linked to a carbon nanotube. The nanotube, which can be open at least one end, is oxidized.

The oxidized nanotube can be shortened by techniques such as acid etching, ion beam milling, ball milling, and gas etching.

In the case where a nanocrystal is a transition metal chalcogenide, the chalcogenide can include an acid terminal group before linking to the nanotube. An acid terminated transition metal chalcogenide nanocrystal can be formed by capping the transition metal chalcogenide with a trioctylphosphine oxide (TOPO), followed by substituting the TOPO cap with a thiol ligand to form an acid terminated transition metal chalcogenide nanocrystal. The thiol ligand can be a bifunctional ligand which includes acid and thiol-terminated moieties. Such bifunctional ligands includes p-mercaptobenzioc acid, thioglycolic acid, and 3-mercaptopropinic acid.

The acid-terminated transition metal chalcogenide nanocrystal can be linked to the nanotube by an organic molecule linker. This reaction can be in the presence of a carbodiimide reagent. Such reagent can be 1-ethyl-3-(3-dimethylaminopropyl) carbodiimide hydrochloride (EDC) or N,N'-dicyclohexylcarbodiimide (DCC). In one preferred embodiment the chalcogenide nanocrystal can be attached to the organic molecule linker before linking with a nanotube. The organic molecular linker can be a bifunctional amine such as ethylenediamine or semicarbazide.

The transition metal chalcogenide nanocrystal can be reacted with ammonium hydroxide to form an amine-terminated transition metal chalcogenide nanocrystal before being linked with a carbonyl carbon of a nanotube.

In one preferred embodiment, an amine-terminated transition metal chalcogenide nanocrystal and an amine-terminated nanotube are formed and linked by a dicarboxylic, acid in the presence of a carbodiimide reagent.

The method also includes a procedure whereby a metal oxide nanocrystal is reacted in the presence of an amine-derivatized acid to form a metal oxide nanocrystal bearing pendant amine groups on its surface, and reacting the nanotube with the amine group bearing-nanocrystal in the presence of a carbodiimide reagent such that a covalent linkage forms between a carbonyl carbon on the nanotube and a pendant amine group.

A titanium dioxide nanocrystal can be reacted in the presence of an amine-terminated aliphatic carboxylic acid to form a titanium dioxide nanocrystal bearing pendant amine groups, and reacting the nanotube with the amine group bearing-nanocrystal in the presence of a carbodiimide reagent such that a covalent linkage forms between a carbonyl carbon on the nanotube and a pendant amine group. The amine-terminated aliphatic carboxylic acid can be 11-aminoundecanoic acid.

The present invention also includes a method of modifying physical properties of a nanocrystal by covalently linking at least one carbonyl nanotube to a nanocrystal. The physical properties can be properties such as electronic properties, electrical properties, electromechanical properties, optical properties, chemical properties, mechanical properties, thermal electric properties, in any combination thereof. The electrical property affected by such modification can be conductance, resistivity, carrier mobility, transport properties, permittivity, and charge transfer properties, in any combination thereof. In the case of conductance, the property can result in a modification in the tunability of conductance.

Structural properties affected can include elasticity, mechanical properties, and ease of composite formation.

The present invention also includes a method of localizing defect sites on a carbon nanotube by adding nanocrystals to the carbon nanotube. The nanocrystals covalently link with the defect sites. The location of the sites are then detected. Such detection can be through microscopy or microspectroscopy. The method also includes the possibility of quantifying defect sites on a carbon nanotube by titrating the carbon nanotube with nanocrystals. Other aspects of the invention include passivating defect sites on a carbon nanotube by covalently linking nanocrystal to the nanotube by covalent linkages.

Yet other aspects of the present invention include a rope of single-walled nanotube-nanocrystal heterostructures having a plurality of oxidized single-walled carbon nanotubes; and a bundle of multi-walled nanotube-nanocrystals heterostructures such as that set forth above. In the case of a rope of such heterostructures, the diameter can be from about 2.5 nm to about 250 nm. In the case of a bundle of such heterostructures, the diameter can be from about 2.5 nm to about 250 nm.

The present invention includes also a method of self-assembling an array of nanotube-nanocrystal heterostructures by placing nanocrystals and oxidized carbon nanotubes in the presence of a catalyst such that nanocrystals form covalent linkages with the oxidized carbon nanotube; and an array of nanotube-nanocrystal heterostructures is self-assembled.

The present invention also includes devices comprising the heterostructure as set forth above. Such devices include, but are not limited to, sensors, a device used in molecular electronics, solar cells, a device used in optoelectronics, a device in used in nanocatalysis, and scanning probe microscopy tips.

The nanotube-nanocrystal heterostructures of the present invention provide several advantages over currently used nanotubes.

For example, unlike current production methods in which the physical properties of the resultant nanotubes cannot be controlled, the methods of the present invention allow for adjustment of physical properties of nanotubes via the production of nanotube-nanocrystal heterostructures. Accordingly, nanotube-nanocrystal heterostructures are provided with particular physical properties that are tailored to meet the needs of various end use applications.

For a better understanding of the present invention, reference is made to the following description, taken in conjunction with the accompanying drawings, and the scope of the invention set forth in the claims.

DETAILED DESCRIPTION OF THE INVENTION

Figure 1A:
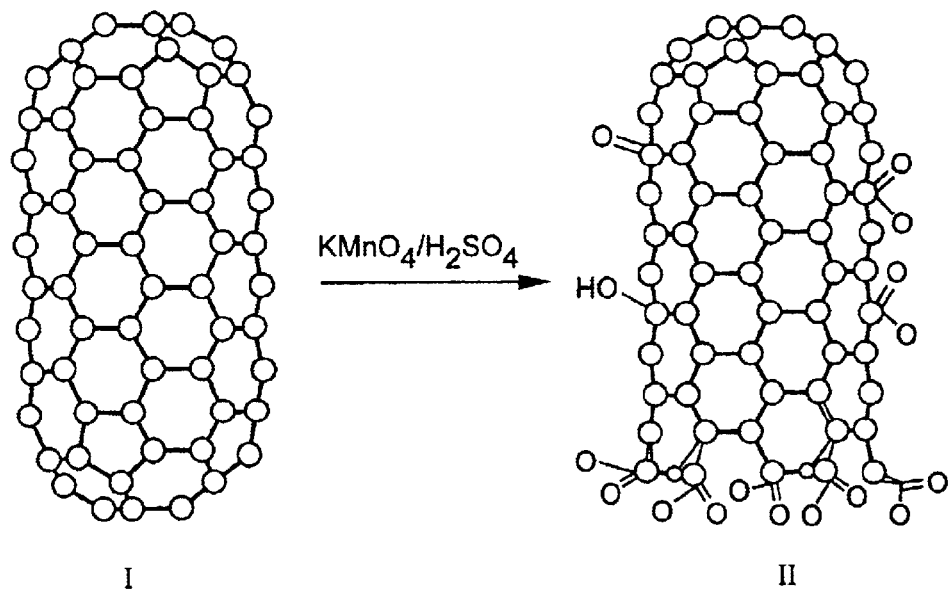
FIG. 1, is a schematic of addition of titanium dioxide nanocrystals to oxidized single-walled carbon nanotubes (OCNTs). (a) Raw SWNTs (I) were treated in a permanganate-sulfuric acid mixture to create opened, oxidized carbon nanotubes [SWNT-COOH] (II). Amine-terminated $TiO_2$ nanoparticles (III) were prepared by the forced hydrolysis of titanium (IV) isopropoxide in the presence of 11-aminoundecanoic acid. (b) (II) and (III) were linked in the presence of EDC to form the adduct (IV). The bonds at the interfaces are not drawn to scale.

The heterostructure of the present invention comprise a carbon nanotube covalently linked to at least one nanocrystal.

The carbon nanotubes of the heterostructure comprise graphene in cylindrical form. The nanotubes preferably have open ends. Alternatively, the nanotubes can have one or two hemispherical caps on their ends. In addition to the hexagonal carbon rings of graphene, the caps can comprise pentagonal rings of carbon. The carbon nanotube can be a semi-conducting nanotube or a metallic nanotube. (A metallic nanotube has no band gap.)

The carbon nanotube can be either single-walled nanotubes (SWNTs) or multi-walled nanotubes (MWNTs). A SWNT comprises only one nanotube. A MWNT comprises more than one nanotube each having a different diameter. Thus, the smallest diameter tube is encapsulated by a larger diameter tube, which in turn, is encapsulated by another larger diameter nanotube.

SWNTs typically have a diameter of about 0.7 to about 2.5 nm, and a length of up to about one mm. MWNTs typically have a diameter of about 3 to about 30 nm, and a length of up to about one mm.

SWNTs ate produced, typically, as ropes of SWNTs where each strand of the rope is a SWNT. A rope comprises a plurality of SWNTs. The diameter of a rope is typically about 10 to 20 nm. MWNTs, typically, are produced either as single MWNTs or as bundles of MWNTs. A bundle comprises a plurality of MWNTs. The diameter of a bundle is typically about 2.5 to 250 nm.

The carbon nanotubes can be prepared by methods known in the art. For example, carbon nanotubes can be prepared by arc discharge (Ishigami, M. et al. *Chem. Phys. Lett.* 319:457 (2000); Su, M. et al. *Chem. Phys. Lett.* 322:321 (2000); Journet, C. et al. *Nature* 388:756 (1997); Colbert et al. *Science* 266:1218, (1994)); Shi, Z. et al. *Carbon* 37:1449 (1999) and Ebbeson, T. et al. *Nature* 358:220 (1992)). The carbon nanotubes can be prepared by laser vaporization (Thess et al. *Science* 273: 483 (1996)). The carbon nanotubes can be prepared by catalytic chemical vapor deposition (Kukovitsky, E. F. et al. *Chem. Phys. Lett.* 317.65 (2000); Su, M. et al. *Chem. Phys. Lett.* 322:321 (2000); Li et al. *Science* 274:1701 (1996); and Pan, Z. et al. *Chem. Phys. Lett.* 299:97 (1999)).

In one embodiment, the carbon nanotubes can be doped with other elements, for example, with metals, boron or nitrogen, by methods known in the art.

The nanocrystal of the heterostructure is any moiety or structure whose intrinsic properties, such as optical and electrical properties, are configurable. Most typically, the intrinsic properties are configurable by varying the particle size of the nanocrystal.

In one embodiment, the nanocrystal is a member of the family of semiconductor nanocrystals, also known as quantum dots. Examples of such quantum dots include the transition metal chalcogenides. Examples of transition metal chalcogenide nanocrystal include zinc sulfide, zinc selenide, zinc telluride, cadmium sulfide, cadmium selenide, cadmium telluride, mercury sulfide, mercury selenide and mercury telluride. Further examples of quantum dots include gallium arsenide, indium gallium arsenide, indium phosphide, indium arsenide, germanium and silicon. Preferably, the quantum dots of the heterostructures are wurtzite cadmium selenide, cadmium sulfide, cadmium telluride, zinc selenide, and zinc sulfide.

Quantum dots exhibit strongly size-dependent optical and electrical properties. In particular, the band gap of these quantum dots increases with decreasing particle size. (Alivisatos, A. P. *J. Phys. Chem.* 100:13226–39 (1996).) For example, by varying the particle size of CdS, the band gap can be tuned between 2.5 and 4 eV. The size of quantum dots can be varied by methods known in the art.

The emission and absorption wavelengths of carbon nanotubes can be adjusted, or tuned, by varying the size of the quantum dots which are linked to the nanotubes. Thus, heterostructures which comprise quantum dots are useful for constructing optoelectronic devices, for instance, with tailored properties.

Formation of quantum dots from Group III-V and Group II-VI semiconductors is described in U.S. Pat. Nos. 5,251,018; 5,505,928; 5,262,357; and 5,990,479 (incorporated herein by reference). The patents also describe how to control the size of the quantum dots using crystal growth terminators. Also, the generation of quantum dots from Group III-V semiconductor compounds has been described (Leonard et al., *Appl. Phys. Left.* 63(23), 3203 (1993) and Micic et al., *Appl. Phys. Left.* 68(22), 3150 (1996)). Preparation of wurtzite CdSe quantum dots has been described (Murray et al. *J. Am. Chem. Soc.* 115:8706 (1993)).

In another embodiment, the nanocrystal of the heterostructure is a member of the family of metal oxide nanocrystals. These nanocrystals exhibit size-dependent magnetic behavior. Examples of suitable metal oxide nanocrystals include titanium dioxide, iron oxide, zirconium oxide, aluminum oxide and ruthenium oxide. Formation of these metal oxides are known in the art. For example, formation of titanium dioxide nanocrystals are described in Cassagneau et al. *Langmuir* 16:241 (2000) and Kotov et al. *J. Phys. Chem.* 99:13065 (1995).

In another embodiment, the nanocrystal of the heterostructure is a colloidal elemental metal nanocrystal. Examples of colloidal elemental metal nanocrystals for use in the heterostructures are gold, silver, platinum, copper, palladium, nickel, iron, rhodium, and iridium. Gold, silver, platinum and copper are preferred. Colloidal elemental metal nanocrystals are prepared by methods known in the art.

In another embodiment, the nanocrystal of the heterostructure is a nanobimetallic dispersion. Examples of such dispersions include silver/iridium, platinum/gold, silver/palladium, platinum/palladium, nickel/palladium and platinum/ruthenium. These dispersions are prepared by methods known in the art (D'Souza, L. et al. *Langmuir* 16:8510 (2000); Lu, P. et al. *J. Phys. Chem. B.* 103:9673 (1999); Mizukoshi, Y. et al. *J. Phys. Chem, B.* 104:6028 (2000) and Nashner, M. S. *J. Am. Chem. Soc.* 120:8093 (1998)).

In one embodiment, a variety of nanocrystal families can be present on a nanotube.

Nanocrystals in accordance with the present invention have an average cross-section no larger than about 60 Å, preferably, no larger than about 50 Å, more preferably about 1 to 50 Å, even more preferably about 10 to 50 Å. For example, the average particle size of a wurtzite CdSe quantum dot can be about 32±3 Å. As another example, the average particle size of a titanium dioxide particle can be about 35±5 Å.

The nanotube and the nanocrystal are covalently linked to one another in the heterostructures. Covalent linkage is the sharing of electrons by a pair of atoms. The covalent linkage can be via a single bond, i.e. one pair of electrons shared, or a double bond, i.e. two pairs of electrons shared. The covalent linkages can also be polar covalent bonds (hybrid bonds). Such bonds are partially ionic in nature; that is, the electrons are not shared equally. The covalent linkage can also be via a coordinate bond. A coordinate bond comprise a pair of electrons donated by only one of the two atoms that are joined.

The production of the heterostrutures of the present invention are preferably based on the presence of carboxyl functional groups on a nanotube by which to allow the covalent linkage with a nanocrystal. During the formation of a nanotube, carboxyl functional groups can arise on the nanotube. Alternatively, carboxyl functional groups can be placed on a nanotube by an oxidation process.

Before linking with a nanocrystal, the carbon nanotubes have at least one carboxyl (—COOH) functional group on their outer surfaces by which covalent linkages are formed with nanocrystals. The carboxyl groups can be anywhere on the outer surfaces of the nanotubes. Preferably, the carboxyl groups are at the tips of open-ended nanotubes.

In one embodiment, carbon nanotubes with the carboxyl functional groups are obtained from an outside source. In another embodiment, carbon nanotubes with carboxyl functional groups are produced by oxidation processes well known in the art.

For example, raw SWNT bundles can be oxidized according to existing procedures involving acidic potassium permanganate solution and hydrochloric acid. See for example Hiura et al. Adv. Mater 7:275 (1995). Also, for example, MWNT samples prepared via arc discharge can be purified by oxidizing the carbon nanotubes at 700° C. in the presence of air until approximately 2% of the original mass remained. SWNT samples can be prepared via arc discharge, pulsed laser vaporization, or chemical vapor deposition. The SWNT samples can be purified by sonication and filtration through 0.8 micron pore membranes. See for example, Bonard et al. Adv. Mat., 9, 827 (1997), K. Tohji et al. J. Phys. Chem. B, 101, 1974 (1997), and K. Tohji et al., Nature, 383, 679, (1996).

In one embodiment, the covalent linkage can be directly between a carbonyl oxygen on the carbon nanotube and a nanocrystal. For example, the linkage can be directly between a colloidal elemental metal nanocrystal and the carbonyl oxygen of the nanotube; or can be directly between a metal oxide nanocrystal and the carbonyl oxygen of the nanotube; or can be directly between a nanobimetallic dispersion nanocrystal and the carbonyl oxygen of the nanotube.

In another embodiment, the covalent linkage can be between a carbonyl carbon of the carbon nanotube and a functional group attached to a nanocrystal. Examples of functional groups are amine and carboxy moieties. The functional group can be directly attached to the nanocrystal, or can be part of an organic molecule linker. Preferably, the linker comprises less than about twenty carbon atoms. An example of an organic molecule linker is a bifunctional amine. Examples of bifunctional amines are alkyl or aryl diamine derivatives. Examples of diamine derivatives are ethylenediamine and semicarbazide.

In another aspect, the present invention provides methods of making the nanotube-nanocrystal heterostructures described above.

A nanotube with at least one carboxyl functional group is provided, or an oxidized carbon nanotube is provided, or a carbon nanotube is oxidized as described above. The carbon nanotubes can be shortened. Techniques by which to shorten nanotubes include acid etching, ion beam milling, ball milling, and gas etching.

In a preferred embodiment, the transition metal chalcogenide nanocrystal has an acid terminal group before linking to the nanotube.

Preferably, the acid-terminated transition metal chalcogenide nanocrystal is formed by a method comprising capping the transition metal chalcogenide with trioctylphosphine oxide (TOPO). The TOPO cap is then substituted with a thiol ligand to form the acid-terminated transition metal chalcogenide nanocrystal.

Preferably, the thiol ligand is a bifunctional ligand comprising acid and thiol-terminated moieties. Examples of a bifunctional ligand includes p-mercaptobenzoic acid, thioglycolic acid, and 3-mercaptopropionic acid.

The acid-terminated transition metal chalcogenide nanocrystal can be linked to the nanotube by several synthetic routes.

For example, prior to combining the nanotube with the acid-terminated nanocrystal, a carboxyl group on the nanotube can be converted into an amide. In an alternative route, the acid-terminated nanocrystal can be converted into an amide prior to combining with the nanotube.

Preferably, the conversion of the carboxyl group on the nanotube into an amide and the conversion of the acid-terminated nanocrystal into an amide are accomplished by reacting them with a bifunctional amine. Preferably, the bifunctional amine is ethylenediamine or semicarbazide. In this way, in the resulting heterostructure, the nanotube and the nanocrystal are separated by an organic molecule linker.

In an alternative method, an amine-terminated transition metal chalcogenide nanocrystal is formed and an amine-terminated nanotube is formed, and the amine-terminated nanotube and the amine-terminated nanocrystal are linked by a dicarboxylic acid.

In the above discussed methods, preferably the nanotube and the amine-terminated nanocrystal; or the amine-terminated nanotube and the acid-terminated nanocrystal; or the amine-terminated nanotube and the amine-terminated nanocrystal is linked in the presence of a carbodiimide reagent. Preferably, the carbodiimide reagent is 1-ethyl-3-(3-dimethylaminopropyl) carbodiimide hydrochloride (EDC) or N,N'-dicyclohexylcarbodiimide (DCC).

In another alternate method an acid-terminated transition metal chalcogenide nanocrystal is reacted with ammonium hydroxide to form an amine-terminated transition metal chalcogenide nanocrystal before linking with a carbonyl carbon of the nanotube. In this method, a carbodiimide reagent is optional.

In another embodiment, a metal oxide nanocrystal is reacted in the presence of an amine-derivatized acid to form a metal oxide nanocrystal which bears pendant amine groups on its surface. A carbon nanotube which has a carboxyl functional group is reacted with the amine group bearing-nanocrystal. Preferably, the reaction is in the presence of a carbodiimide reagent. A covalent linkage forms between a carbonyl carbon on the nanotube and a pendant amine group. In this method, the presence of a carbodiimide reagent is preferred.

For example, a titanium dioxide nanocrystal is formed in the presence of an amine-terminated aliphatic carboxylic acid to form a titanium dioxide nanocrystal which bears pendant amine groups. An oxidized nanotube is reacted with the amine group bearing-nanocrystal in the presence of a carbodiimide reagent. Preferably, the amine-terminated alkylated carboxylic acid is 11-aminoundecanoic acid.

In an alternate embodiment, the metal oxide nanocrystal is reacted with the oxidized nanotube. The presence of a carbodiimide reagent is optional. A covalent linkage forms between a carbonyl oxygen on the nanotube and a metal atom on the metal surface.

In another aspect of the invention, a method of modifying a physical property of a nanotube is provided. The method comprises covalently linking at least one nanocrystal to a carbon nanotube.

In another aspect of the invention, a method of modifying a physical property of a nanocrystal is provided. The method comprises covalently linking at least one carbon nanotube to a nanocrystal.

The physical property which is modified is, for example, electronic properties, electrical properties, electromechanical properties, optical properties, chemical properties, mechanical properties, structural properties and thermoelectric properties.

The electrical property which is modified can be, for example, conductance, resistivity, carrier mobility, transport properties, permittivity, and charge transfer properties. The modification of conductance can be, for example, a tunability in conductance. For example, with particular nanocrystals, as the particle size of a nanocrystal is increased, the conductance of the nanotube is increased.

The structural property which is modified can be, for example, elasticity, mechanical properties, and ease of composite formation.

In another aspect of the invention, a method of localizing defect sites on a carbon nanotube is provided. The method comprising adding nanocrystals to a carbon nanotube. The nanocrystals form covalent linkages with the defect sites. The location of the sites are detected. The detection is accomplished with microscopy or micro-spectroscopy. Examples of microscopy include transmission electron, scanning electron and atomic force microscopy.

In another aspect of the invention, a method of quantifying defect sites on a carbon nanotube is provided. The method comprises titrating the carbon nanotube with nanocrystals.

In another aspect of the invention, a method of passivating defect sites on a carbon nanotube is provided. The method comprises adding nanocrystals to a carbon nanotube. The nanocrystals form covalent linkages with the defect sites thereby passivating the defect sites. Thus, the conductance of the nanotubes can be improved.

In another aspect of the invention, a method of self assembling an array of nanotube-nanocrystal heterostructures is provided. The method comprises placing nanocrystals and oxidized carbon nanotube in the presence of a catalyst, wherein the nanocrystals form covalent linkages with the oxidized carbon nanotube.

In another aspect of the invention, a device comprising the heterostructure is provided. The device can be, for example, sensors, a device used in molecular electronics, solar cells, a device used in optoelectronics, a device used in nanocatalysis, and scanning probe microscopy tips.

EXAMPLES

Starting materials and reagents were characterized by UV-visible spectroscopy (Beckmann Coulter DU600 and ThermoSpectronics UV 1), transmission electron microscopy (TEM, Philips CM12), scanning electron microscopy (SEM, Leo 1550 with a field emission column), and energy-dispersive X-ray spectroscopy (EDS). For microscopy analyses, a portion of the solid was dispersed in ethanol by mild sonication and evaporated over a 300 mesh Cu grid, coated with a lacey carbon film. The nanotubenanocrystal adduct was analyzed by TEM, FT-IR spectroscopy (Mattson Galaxy FT-IR 3000), and UV-visible spectroscopy.

Example 1

Oxidation of Nanotubes

Figure 3A:
FIG. 3, is a transmission electron micrographs taken at 120 kV on a 300 mesh Cu grid with a lacey carbon film. (a) A purified single-walled carbon nanotube bundle. Scale bar denotes 30 nm. (b) Oxidized carbon nanotube bundle circumscribed by capped $TiO_2$ particles. Scale bar represents 45 nm. (c) Oxidized tubes linked to CdSe nanocrystals capped with 4-mercaptobenzoic acid. The crystallites are concentrated at the functionalized open ends, with some coverage on the sidewalls. Scale bar is 150 nm. (d) Oxidized nanotube linked to CdSe nanoparticles capped with 3-mercaptopropionic acid. Image at high magnification shows prolate nanocrystals scattered along the length of the tube. Scale bar signifies 20 nm.

Raw SWNT bundles (Carbolex; length range of 0.8–1.2 $\mu$m and widely varying width) were thoroughly oxidized according to existing procedures involving acidic potassium permanganate solution and hydrochloric acid. This treatment has been shown to coat the nanotube sidewalls with keto, carboxylic, aldehyde, and alcoholic groups. TEM analyses indicated that the oxidation process not only removed amorphous carbon but also the majority of metal particles (FIG. 3a) as well. The purified tubes were then dried in a vacuum oven at 180° C. Carboxylic acid groups are expected to be the predominant group along the sidewalls. This was followed by acid etching in 2.6 M $HNO_3$ to further shorten the tubes. TEM analysis showed that oxidation and etching removed most of the amorphous carbon and metal catalyst particles. The remaining tubes obtained, for the most part, were relatively free of impurities, such as particulates, and either one or both of the tube caps were opened. The tubes were also substantially shortened after acid etching, ranging in length from 100 to 200 nm. Although the tubes need not be shortened to such an extent.

Example 2

Preparation of CdSe Nanocrystals

Wurtzite CdSe nanocrystals capped with trioctylphosphine oxide (TOPO) were synthesized by existing procedures, using purified dimethylcadmium as a precursor. After dissolution in hexane and ethanol, a sharp low energy exciton was centered at 550 nm in the absorption spectrum (FIG. 4b) of the orange-red sample. The sample prepared was relatively monodisperse with an average particle size of 32±3 Å, a figure derived from comparison of our data with experimental, room-temperature optical absorption spectra from previous reports, and confirmed by TEM data. The presence of TOPO capping was demonstrated by a strong phosphide signal in the energy dispersive spectrum. However, TOPO molecules are not strongly bound to the nanocrystals themselves, as they can be washed away by polar solvents such as methanol.

To create a relatively robust ligand shell, CdSe quantum dots were further derivatized with several other moieties, prepared through a ligand exchange reaction. Thioalcohols and thio acids have been shown to be effective size-regulating and stabilizing agents for cadmium chalcogenide nanoparticles. Moreover, they strongly attach to the CdSe surface, yielding a uniform surface coverage of passivating caps; indeed, the richness of thiol chemistry was taken advantage of to vary terminal functional groups at the nanocrystal surface, which is crucial for chemical manipulation of these nanostructures.

Figure 4A:
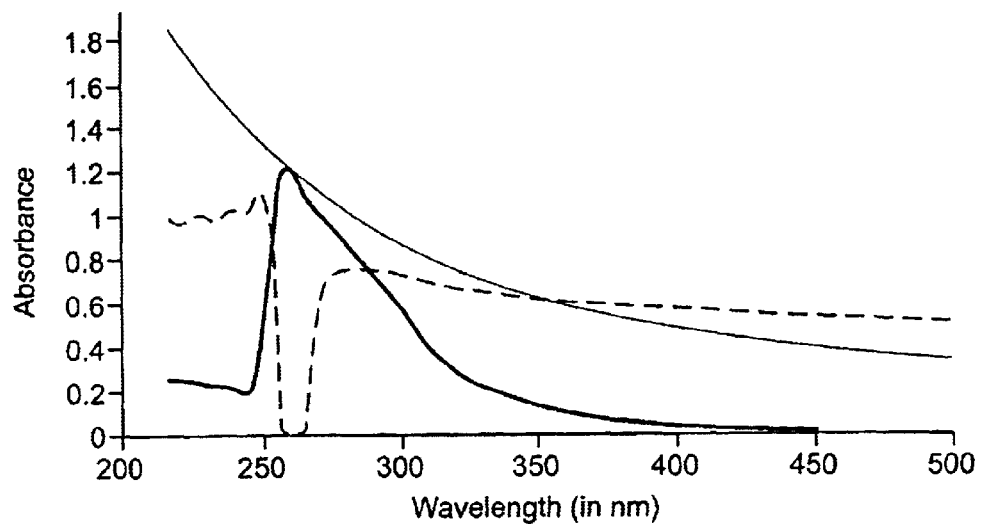
FIG. 4, is a UV-visible absorption spectra of nanotube-nanocrystal; composites. (a) $TiO_2$ nanoparticle covalently joined to a carbon nanotube. The spectrum corresponding to the carbon nanotube is relatively featureless; that of the $TiO_2$ nanocrystal has a peak at 259 nm, whereas the nanotube-nanocrystal adduct product has peaks at 227, 239, 249, and 288 nm. (b) CdSe nanocrystal covalently linked to a carbon nanotube. The spectrum corresponding to the carbon nanotube is featureless; that of the CdSe nanocrystal has a peak at 550 nm, while the nanotube-nanocrystal adduct product has peaks at 256 and 274 nm.
Figure 4B:
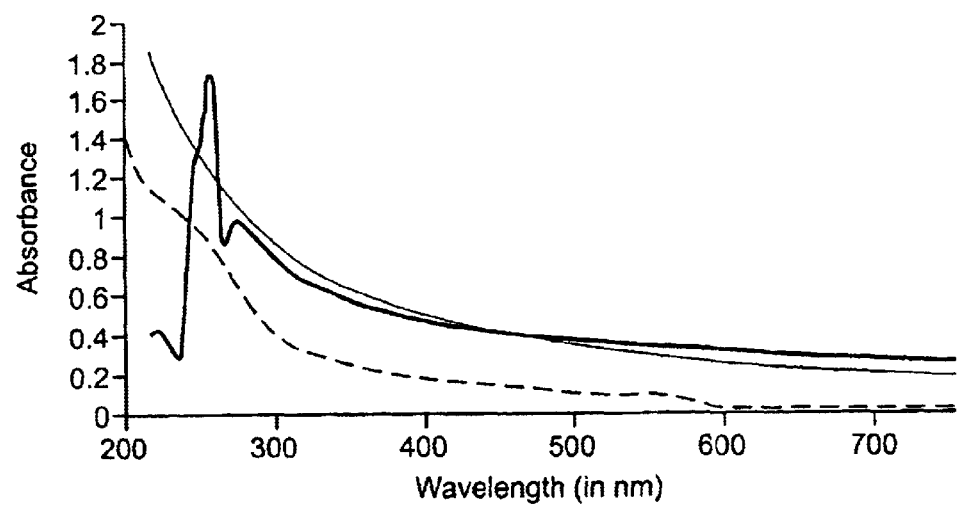

To demonstrate the generalizability of our derivatization methodology, a range of different mercaptocarboxylic ligands was chosen, of different hydrocarbon chain lengths and composition, to ensure a certain level of solubility in DMF, the reaction medium. These included p-mercaptobenzoic acid, thioglycolic acid, and 3-mercaptopropionic acid (Aldrich). (Chen et al. *Langimuir* 15:6845 (2000).) The UV-visible spectrum in methanol showed a small blue shift upon capping with thiols in the ligand exchange reaction; the peaks of the optical features were also somewhat broadened, especially with samples capped with the aliphatic mercaptoacid derivatives (FIG. 4b). While the former situation indicated a slight decrease in the average size of the crystallites (5–10%) presumably due to the smaller size of these thiols with respect to the starting TOPO molecules, the latter observation indicates an increased broadness in size distribution (standard deviation in size from 8% to 15%), which has been attributed to a loss of some surface Cd and Se species.

The success of the capping reactions was further confirmed by the elemental signature of sulfur in the EDS spectrum; the size distribution of the particles, deduced by optical means, was further confirmed by TEM. The capping of CdSe with longer chain mercaptothiols, most notably with 11-mercapto-1-undecanol and 16-mercaptohexadecanoic acid, were performed. These, however, were found not to link particularly well to nanotubes, potentially because of steric and configurational considerations involving the lower numbers of as well as the geometric packing of the long alkyl chains, which most likely prevented easy access of a substantial number of reactive surface ligands on the nanocrystals to the tubes themselves.

Example 3

Preparation of TiO$_2$ Nanocrystals

Spherical functionalized titania nanoparticles were prepared by an adaptation of a previously existing procedure. (Cassagneau et al. *Langmuir* 16:2412 (2000).) To summarize, these particles were synthesized by the slow hydrolysis of titanium tetraisopropoxide (Aldrich) in the presence of an alcoholic solution of 11-aminoundecanoic acid (Aldrich). The UV-visible spectra of transparent TiO$_2$ solutions (FIG. 4a) in ethanol showed the onset of absorption below 400 nm and an absorption maximum at 259 nm, which agrees closely with previous reports. Transmission electron and scanning electron microscopy showed that the size of the nanoparticles was 35±5 Å 5, consistent with optical data as well. EDS spectroscopy confirmed the expected elemental signatures in the capped anastase TiO$_2$ particles.

Example 4

Preparation of Heterostructures Comprising CdSe Nanocrystals

When forming quantum dot-nanotube structures, intermediary linking agents, ethylenediamine (en) and semicarbazide (sc), both of which are diamines, were used to attach the capped CdSe nanoparticles to the nanotubes. In a typical synthesis, the oxidized nanotubes (OCNTs) were dispersed in DMF by sonication for 5 min, after which an aliquot of 0.1 M (2-N-morpholino) ethanesulfonic acid (MES) (Aldrich) in distilled water buffer was added, followed by a few ml of neat en or 0.1 M solution of sc in DMF and 5 mL of 50 mM 1-ethyl-3(3-dimethylaminopropyl) carbodiimide hydrochloride (EDC) (Aldrich) in DMF. EDC promotes the formation of an amide bond between carboxylic groups on the OCNT and either en or sc. The reaction mixture was sonicated briefly to maintain a dispersion of nanotubes, stirred vigorously for 48 h under nitrogen, and then filtered over a 0.2 $\mu$m nylon 6,6 membrane. The resulting solution was washed repeatedly first with ethanol and then water, prior to drying under vacuum for 12 h. The functionalized amine-terminated OCNTs were then soaked and sonicated in DMF with subsequent addition of 50 mM of EDC in DMF to which 0.1 M MES in distilled H$_2$O had been added.

The main linking step thereafter to synthesize quantum dot-nanotube heterostructures involved reacting the previously prepared acid-capped CdSe nanocrystal solids with these modified tubes, followed by stirring for 3 days at room temperature. The EDC effectively attached the amine groups, emanating from the functionalized OCNTs, to the carboxylic acid groups, terminating from the surface capping ligands on the CdSe nanocrystal. After filtration over a 0.2, $\mu$m nylon 6,6 membrane, the solid precipitate was washed repeatedly with water and ethanol; the filtrate was clear and did not show any CdSe absorption peaks, suggesting that the reaction proceeded to completion in the solid phase. The resulting solid was then dried under vacuum for 4 h.

An alternative method of creating the nanotube-nanocrystal composite has been to react the mercaptocarboxylic acid capped nanocrystal with ammonium hydroxide at 0° C. in a process to form an amide terminated system (without the need for intermediary linkers) that can then be directly linked to the OCNTs.

A third, equally reliable strategy we used involved initially attaching the acid-terminated nanocrystal to the linker molecule (either en or sc) prior to reaction with the acid-terminated OCNTs.

Example 5

Preparation of Heterostructures Comprising TiO$_2$ Nanocrystals

Figure 1B:
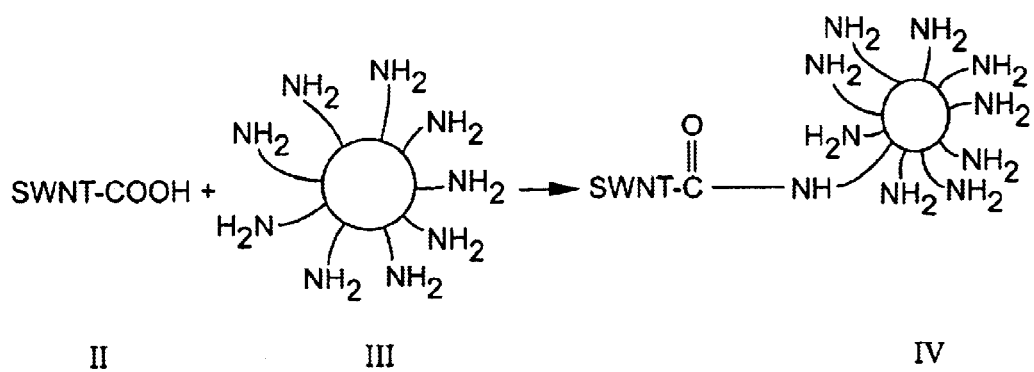
Figure 2A:
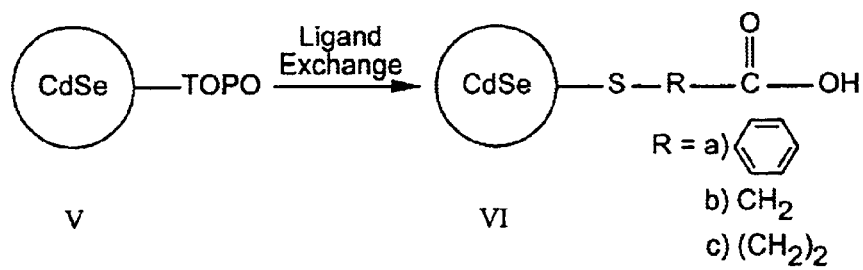
FIG. 2, is a schematic of addition of CdSe nanocrystals to OCNTs. TOPO capped nanocrystals (V) were prepared by established methods using organometallic precursors. (a) TOPO capping was substituted by a thiol ligand to form an acid-terminated CdSe nanocrystal (VI). Substituted thiocarboxylic acids used included p-mercaptobenzoic acid, thioglycolic acid, and 3-mercaptopropionic acid, as represented by different R groups shown. (b) (VI) was linked to OCNTs (II) by an ethylenediamine linker (VII) in the presence of EDC to form the adduct (VIII). The bonds at the interfaces are not drawn to scale.
Figure 2B:
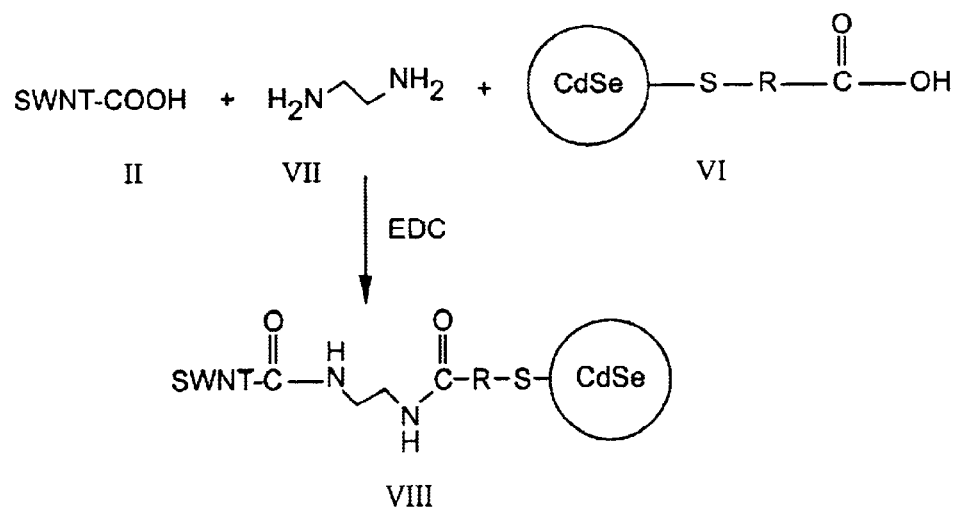

In a typical synthesis to create a composite containing carbon nanotubes and titanium oxide nanocrystals using analogous reactions described above, solutions of capped, amine-terminated nanoparticles and oxidized, acid-terminated nanotubes were directly mixed and sonicated in DMF in the presence of 0.1 M MES in H$_2$O and 50 mM EDC in DMF. The reaction mixture was stirred vigorously for 24 h, allowed to settle for an extra 24 h, and ultimately filtered over a 0.2 $\mu$m nylon 6,6 membrane. The nanocomposite solid was then washed with water and EtOH repeatedly and dried under vacuum. FIGS. 1 and 2 show stylized schematics of the reactions involving both types of nanocrystals with carbon nanotubes.

Example 6

Analysis of Heterostructures

Figure 3B:
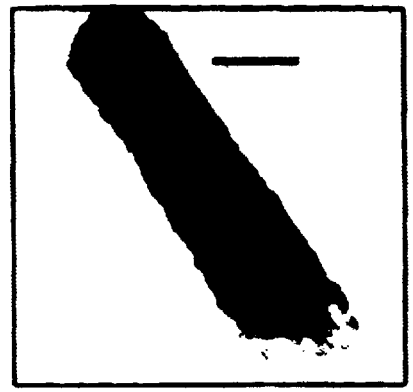
Figure 3C:
Figure 3D:

TEM examination at an accelerating voltage of 120 kV showed nanocrystals linked to the OCNTs, forming discrete nanocomposites. The nanocrystals tend to be concentrated at the open caps and the "ends", where there is the largest concentration of carboxylic groups, and thus, the highest probability of amide bond formation. A commonly observed structure was a cluster of nanoparticles, especially in the case of CdSe, localized at the outer edges of the tubes (FIG. 3c). In other cases, especially with longer and thinner tubes, numbers of nanocrystals tended to disperse along the sidewalls, presumably attaching to defect sites on the oxidized nanotube surface (FIG. 3d). The titanium dioxide system showed substantially greater coverage of the tubes with the nanoparticles (FIG. 3b). It is known that carboxyl groups adsorb strongly onto bare titanium dioxide surfaces. Hence, larger numbers of these particles can interact with nanotubes and in effect, amide bond formation is not required for an underivatized, uncapped titanium oxide-OCNT adduct to be directly produced.

EDS analysis on both nanocomposite systems was consistent with the presence of appropriately functionalized nanocrystals attached to nanotubes. The samples show some amount of dispersed unreacted nanocrystals. These patterns of nanocrystal clustering on the nanotubes were not observed in control experiments, without the use of EDC, where the tubes themselves were found to remain totally separate from the nanocrystals.

FT-IR spectra provide further evidence for bonding. The amide bond region shows several sharp and distinctive peaks. The peaks are numerous but sharp and unbroadened and likely correspond to distinctive modes of bonding between the OCNTs and the nanocrystals. All the spectra (KBr pressed pellet) show a peak at 1581 $cm^{-1}$, corresponding to the IR active phonon mode of nanotubes that has been previously reported. In addition, the sharpest peak in all the spectra occurs at 1638 $cm^{-1}$, located in the amide bond region. This may correspond to an amide bond, potentially correlating with unreacted amine groups attached to the modified nanotube ends as well as with amide bonds of the linker groups associated with the capping ligands. Previous observations of amide bonds in carbon nanotubes linked to amines have been noted at 1663 and 1642 $cm^{-1}$. The region of the mid-IR around 1615–1580 $cm^{-1}$ also has a number of distinctive peaks, thus at least some of the bonding can occur through an additional ionic, noncovalent $COO—NH_3^+$ interaction, since previous work has attributed $u_{co}$ in this region to carboxylate anion stretch modes in such interactions.

Peaks observed in the 3000–2850 $cm^{-1}$ range are likely a result of C—H stretches within the intermediary linkers used as well as within the aliphatic chains, when aliphatic thiocarboxylic acids were used as capping groups. This assignment is confirmed by the disappearance of these peaks in the specific example of mercaptobenzoic acid, associated with the SWNT-CONH—$C_6H_4S$—CdSe adduct, where neither en nor sc was used and the CdSe nanocrystal in that case was effectively capped by an aromatic thioamide. Aliphatic C—H stretches are shifted 10–15 $cm^{-1}$ from C—H stretches in neat en or sc. Similarly, the C—H bends, noted in en at 1459 $cm^{-1}$ and in sc at 1438 and 1484 $cm^{-1}$, are in a range from 1422 to 1469 $cm^{-1}$ in the adduct. A shift upon product formation is also seen for C—C aromatic stretches in the mercaptobenzoic acid ligand from an initial value of 1554 $cm^{-1}$ to a range of 1543 to 1578 $cm^{-1}$ depending on the mode of linkage to the nanotube. These results are consistent with a similar type of interpretation of IR spectra for derivatized SWNTs, which has been previously reported.

The absorption spectrum for OCNT is featureless in the 200–800 nm region, while $TiO_2$ nanocrystals show absorption below 400 nm with a peak at 259 nm. The adduct product shows peaks at 227, 239, 249, and 288 nm. The broad band centered about 288 nm, coupled with depletion of the band at 259 nm, corresponds to a charge-transfer transition involving electron transfer to the titanium dioxide surface and lattice, thereby suggesting that charge separation has been achieved.

In contrast to titanium dioxide, which has a large band gap and a low lying conduction band, CdSe has a high lying conduction band and a low band gap; hence; the charge injection occurs from the nanocrystal to the nanotube in that case. Evidence for this is shown (FIG. 4b) from the disappearance of the lowest energy exciton in the adduct at around 550 nm, corresponding to the band gap excitation in the initial nanocrystal reagent solution. Indeed, for the adduct, distinctive, intense, and sharp charge transfer bands appear at lower wavelengths (<300 nm), specifically at 256 and 279 nm, and the absorbance spectrum, though featureless, at higher wavelengths is increased from that of individual nanotubes alone. In a few cases, as with the mercaptopropionic acid ligand, the absorption spectra show a small shoulder around 515 nm, characteristic of CdSe itself.

Thus, while there have been described what are presently believed to be the preferred embodiments of the present invention, other and further embodiments, modifications, and improvements will be known to those skilled in the art, and it is intended to include all such further embodiments, modifications, and improvements and come within the true scope of the claims as set forth below.

We claim:

1. A heterostructure comprising a carbon nanotube covalently linked to at least one nanocrystal.

2. The heterostructure of claim 1 wherein the linkage is between a carbonyl oxygen of the carbon nanotube and the nanocrystal, or between a carbonyl carbon of the carbon nanotube and a functional group on the nanocrystal, or between a carbonyl carbon of the carbon nanotube and a functional group on a linker attached to the nanocrystal.

3. The heterostructure of claim 2 wherein the nanocrystal is a transition metal chalcogenide.

4. The heterostructure of claim 3 wherein the transition metal chalcogenide nanocrystal is a wurtzite cadmium selenide, cadmium sulfide, cadmium telluride, zinc selenide, or zinc sulfide.

5. The heterostructure of claim 3 wherein the transition metal chalcogenide nanocrystal is a mercury sulfide, mercury selenide, mercury telluride or zinc telluride.

6. The heterostructure of claim 2 wherein the nanocrystal is gallium arsenide, indium gallium arsenide, indium phosphide, indium arsenide, germanium or silicon.

7. The heterostructure of claim 2 wherein the nanocrystal is a metal oxide.

8. The heterostructure of claim 7 wherein the metal oxide is a titanium dioxide.

9. The heterostructure of claim 7 wherein the metal oxide is a zirconium oxide, aluminum oxide, iron oxide or ruthenium oxide.

10. The heterostructure of claim 2 wherein the nanocrystal is a colloidal elemental metal.

11. The heterostructure of claim 7 wherein the colloidal elemental metal is gold, silver, platinum or copper.

12. The heterostructure of claim 2 wherein the nanocrystal is a nanobimetallic dispersion.

13. The heterostructure of claim 12 wherein the nanobimetallic dispersion is silver/iridium, platinum/gold, silver/palladium, platinum/palladium, nickel/palladium or platinum/ruthenium.

14. The heterostructure of claim 1 wherein the covalent linkage is formed between a carbonyl carbon of the nanotube and an amine group attached to the nanocrystal.

15. The heterostructure of claim 14 wherein the amine group is directly attached to the nanocrystal.

16. The heterostructure of claim 14 wherein the amine group is part of an organic molecule linker wherein the linker comprises less than about twenty carbon atoms.

17. The heterostructure of claim 16 wherein the organic molecule linker is a bifunctional amine.

18. The heterostructure of claim 17 wherein the bifunctional amine is an alkyl or aryl diamine derivative.

19. The heterostructure of claim 18 wherein the diamine derivative is selected from the group consisting of ethylenediamine and semicarbazide.

20. The heterostructure of claim 1 wherein the carbon nanotube is single-walled.

21. The heterostructure of claim 1 wherein the carbon nanotube is multi-walled.

22. The heterostructure of claim 1 wherein the carbon nanotube is a semi-conductor.

23. The heterostructure of claim 1 wherein the carbon nanotube is a metal.

24. The heterostructure of claim 1 wherein the nanocrystal is a semi-conductor.

25. The heterostructure of claim 20 wherein the diameter of the single-walled carbon nanotube is about 0.7 to about 2.5 nm.

26. The heterostructure of claim 21 wherein the diameter of the multi-walled carbon nanotube is about 3 to about 30 nm.

27. The heterostructure of claim 1 wherein the particle size of the nanocrystal is about 1 to 20 nm.

28. The heterostructure of claim 1 wherein the end of the carbon nanotube is open.

29. A method of producing a nanotube-nanocrystal heterostructure comprising covalently linking a nanocrystal to a carbon nanotube wherein a nanotube-nanocrystal heterostructure is produced.

30. The method according to claim 29 wherein the nanotube is oxidized.

31. The method of claim 29 wherein at least one end of the carbon nanotube is open.

32. The method of claim 29 further comprising shortening the oxidized nanotube.

33. The method of claim 32 wherein the nanotube is shortened by acid etching ion beam milling, ball milling or gas etching.

34. The method of claim 29 wherein the nanocrystal is a transition metal chalcogenide.

35. The method of claim 34 wherein the transition metal chalcogenide is a wurtzite cadmium selenide, cadmium sulfide, cadmium telluride, zinc selenide, or zinc sulfide.

36. The method of claim 29 wherein the nanocrystal is a metal oxide.

37. The method of claim 36 wherein the metal oxide is a titanium dioxide.

38. The method of claim 29 wherein the nanocrystal is selected from a group consisting of colloidal elemental gold, silver, platinum and copper.

39. The method of claim 29 wherein the nanocrystal is gallium arsenide, indium gallium arsenide, indium phosphide, indium arsenide, germanium, silicon, gallium arsenide, indium gallium arsenide, indium phosphide, indium arsenide, germanium or silicon.

40. The method of claim 34 wherein the transition metal chalcogenide nanocrystal has an acid terminal group before linking to the nanotube.

41. The method of claim 40 wherein the acid-terminated transition metal chalcogenide nanocrystal is formed by a method comprising:

(a) capping the transition metal chalcogenide with trioctylphosphine oxide (TOPO);
(b) substituting the TOPO cap with a thiol ligand to form the acid-terminated transition metal chalcogenide nanocrystal.

42. The method of claim 41 wherein the thiol ligand is a bifunctional ligand comprising acid and thiol-terminated moieties.

43. The method of claim 42 wherein the bifunctional ligand is p-mercaptobenzoic acid, thioglycolic acid, or 3-mercaptopropionic acid.

44. The method according to claim 40 wherein the acid terminal group on the nanocrystal is converted into an amide before linking with the nanotube.

45. The method according to claim 40 wherein a carboxylic group on the nanotube is converted into an amide before linking with the nanocrystal.

46. The method of claim 44 wherein the acid terminal group on the nanocrystal is converted into an amide by reacting the nanocrystal with a bifunctional amine.

47. The method of claim 45 wherein a carboxylic group on the nanotube is converted into an amide by reacting the nanocrystal with a bifunctional amine.

48. The method of claim 46 wherein the bifunctional amine is ethylenediamine or semicarbazide.

49. The method of claim 47 wherein the bifunctional amine is ethylenediamine or semicarbazide.

50. The method of claim 40 wherein the nanotube and the transition metal chalcogenide nanocrystal are linked by an organic molecule linker in the presence of a carbodiimide reagent.

51. The method of claim 50 wherein the carbodiimide reagent is 1-ethyl-3-(3-dimethylaminopropyl) carbodiimide hydrochloride (EDC) or N, N'-dicyclohexylcarbodiimide (DCC).

52. The method of claim 50 wherein the acid-terminated transition metal chalcogenide nanocrystal is attached to the organic molecule linker before linking with the nanotube.

53. The method of claim 50 wherein the nanotube is attached to the organic molecule linker before linking with the acid-terminated transition metal chalcogenide nanocrystal.

54. The method of claim 40 wherein the acid-terminated transition metal chalcogenide nanocrystal is reacted with ammonium hydroxide to form an amine-terminated transition metal chalcogenide nanocrystal before linking with a carbonyl carbon of the nanotube.

55. The method of claim 40 wherein an amine-terminated transition metal chalcogenide nanocrystal is formed and an amine-terminated nanotube is formed, and the amine-terminated nanotube and the amine-terminated nanocrystal are linked by a dicarboxylic acid in the presence of a carbodiimide reagent.

56. The method of claim 36 wherein the metal oxide nanocrystal is formed in the presence of a amine-derivatized acid to form a metal oxide nanocrystal which bears pendant amine groups on its surface, and reacting the oxidized nanotube with the amine group bearing-nanocrystal, in the presence of a carbodiimide reagent.

57. The method of claim 56 wherein a titanium dioxide nanocrystal is formed in the presence of an amine-terminated aliphatic carboxylic acid to form a titanium dioxide nanocrystal which bears pendant amine groups, and reacting the oxidized nanotube with the amine group bearing-nanocrystal in the presence of a carbodiimide reagent.

58. The method of claim 57 wherein the amine-terminated aliphatic carboxylic acid is 11-aminoundecanoic acid.

59. The method of claim 36 wherein the metal oxide nanocrystal is reacted with the oxidized nanotube, wherein the covalent linkage forms between a carbonyl oxygen on the nanotube and a metal atom on the metal surface.

60. The method of claim 29 wherein the carbon nanotube is single-walled.

61. The method of claim 29 wherein the carbon nanotube is multi-walled.

62. The method of claim 29 wherein the carbon nanotube is a semi-conductor.

63. The method of claim 29 wherein the carbon nanotube is a metal.

64. The method of claim 29 wherein the nanocrystal is a semi-conductor.

65. The method of claim 60 wherein the diameter of the single-walled carbon nanotube is about 0.7 to about 2.5 nm.

66. The method of claim 61 wherein the diameter of the multi-walled carbon nanotube is about 3 to about 30 nm.

67. The method of claim 29 wherein the particle size of the nanocrystal is about 1 to 20 nm.

68. A method of modifying a physical property of a nanotube wherein the method comprises covalently linking at least one nanocrystal to a carbon nanotube.

69. A method of modifying a physical property of a nanocrystal wherein the method comprises covalently linking at least one carbon nanotube to a nanocrystal.

70. A method according to claim 68 wherein the physical property is selected from the group consisting of electronic properties, electrical properties, electromechanical properties, optical properties, chemical properties, mechanical properties, structural properties and thermoelectric properties.

71. A method according to claim 70 wherein the electrical property is selected from the group consisting of conductance, resistivity, carrier mobility, transport properties, permittivity, and charge transfer properties.

72. A method according to claim 71 wherein the modification of conductance is a tunability in conductance.

73. A method according to claim 70 wherein the structural property is selected from the group consisting of elasticity, mechanical properties, and ease of composite formation.

74. A method of localizing defect sites on a carbon nanotube comprising:

(a) adding nanocrystals to the carbon nanotube wherein the nanocrystals form covalent linkages with the defect sites; and (b) detecting the location of the sites.

75. A method according to claim 74 wherein the detection is through microscopy or micro-spectroscopy.

76. A method of quantifying defect sites on a carbon nanotube comprising titrating the carbon nanotube with nanocrystals.

77. A method of passivating defect sites on a carbon nanotube comprising adding nanocrystals to the carbon nanotube wherein the nanocrystals form covalent linkages with the defect sites thereby passivating the defect sites.

78. A rope of single-walled nanotube-nanocrystal heterostructures comprising a plurality of oxidized single-walled carbon nanotubes, wherein each nanotube is covalently linked to at least one nanocrystal.

79. A bundle of multi-walled nanotube-nanocrystal heterostructures comprising a plurality of oxidized multi-walled carbon nanotubes, wherein each nanotube is covalently linked to at least one nanocrystal.

80. The rope of claim 78 wherein the diameter of the rope is about 2.5 to 250 nm.

81. The bundle of claim 79 wherein the diameter of the bundle is about 2.5 to 250 nm.

82. A method of self assembling an array of nanotube-nanocrystal heterostructures comprising:

placing nanocrystals and oxidized carbon nanotube in the presence of a catalyst, wherein the nanocrystals form covalent linkages with the oxidized carbon nanotube and wherein array of nanotube-nanocrystal heterostructures is self-assembled.

83. A device comprising the heterostructure of claim 1 wherein the device is selected from the group consisting of sensors, a device used in molecular electronics, solar cells, a device used in optoelectronics, a device used in nanocatalysis, and scanning probe microscopy tips.

84. The method of claim 29 wherein the nanocrystal is mercury sulfide, mercury selenide, mercury telluride or zinc telluride.

* * * * *